United States Patent
Caubet et al.

(10) Patent No.: US 7,851,915 B2
(45) Date of Patent: Dec. 14, 2010

(54) ELECTRONIC COMPONENT COMPRISING A TITANIUM CARBONITRIDE (TICN) BARRIER LAYER AND PROCESS OF MAKING THE SAME

(75) Inventors: Pierre Caubet, Le Versoud (FR); Rym Benaboud, Saint Martin d'Hères (FR)

(73) Assignee: STMicroelectronics S.A., Montrouge (FR)

( * ) Notice: Subject to any disclaimer, the term of this patent is extended or adjusted under 35 U.S.C. 154(b) by 92 days.

(21) Appl. No.: 12/112,903

(22) Filed: Apr. 30, 2008

(65) Prior Publication Data

US 2008/0290417 A1    Nov. 27, 2008

(30) Foreign Application Priority Data

Apr. 30, 2007 (FR) .................. 07 03133

(51) Int. Cl.
    *H01L 24/48* (2006.01)
(52) U.S. Cl. ............. 257/751; 257/764; 257/E21.292
(58) Field of Classification Search ......... 257/751, 257/764; 438/785
    See application file for complete search history.

(56) References Cited

U.S. PATENT DOCUMENTS

| 5,536,947 | A | * | 7/1996 | Klersy et al. | 257/3 |
|---|---|---|---|---|---|
| 5,965,911 | A | * | 10/1999 | Joo et al. | 257/288 |
| 6,211,072 | B1 | * | 4/2001 | Brennan | 438/648 |
| 2004/0033650 | A1 | | 2/2004 | Sandhu et al. | |
| 2004/0175926 | A1 | * | 9/2004 | Wang et al. | 438/627 |
| 2006/0151823 | A1 | | 7/2006 | Govindarajan | |
| 2007/0042577 | A1 | | 2/2007 | Ishizaka | |
| 2008/0211065 | A1 | * | 9/2008 | Govindarajan | 257/635 |

OTHER PUBLICATIONS

Eizenberg et al., "Chemical Vapor Deposited TiCN: A New Barrier Metallization for Submicron Via and Contact Applications", J. Vac. Sci. Technol. A 13(3):590-595, May/Jun. 1995.

* cited by examiner

*Primary Examiner*—Chuong A Luu
*Assistant Examiner*—Nga Doan
(74) *Attorney, Agent, or Firm*—Lisa K. Jorgenson; Hai Han; Seed IP Law Group PLLC

(57) ABSTRACT

An electronic component comprising several superimposed layers of materials including a TiCN barrier layer. A process for depositing a TiCN layer in order to obtain an electronic component, where a titanium precursor is chosen from among tetrakis(dimethylamido)titanium and/or tetrakis(diethylamido)titanium and is decomposed on a substrate by plasma-enhanced atomic layer deposition (PEALD) where the plasma is obtained with a hydrogen-rich gas which can contain nitrogen with at most 5 atomic % nitrogen and at least 95 atomic % hydrogen.

17 Claims, 1 Drawing Sheet

ELECTRONIC COMPONENT COMPRISING A TITANIUM CARBONITRIDE (TICN) BARRIER LAYER AND PROCESS OF MAKING THE SAME

BACKGROUND

1. Technical Field

This invention relates to an electronic component comprising a barrier layer of an advantageous composition. Such an electronic component can be part of an integrated electronic circuit.

2. Description of the Related Art

"Electronic component" is understood to mean any element based on an electrical and/or electronic circuit, active or passive, intended to be assembled with other electronic components in order to realize one or more electronic functions. Examples of active electronic components are transistors, diodes, and integrated circuits, and examples of passive electronic components are resistors, capacitors, coils, and filters.

"Barrier layer" is understood to mean a layer of material able to prevent, very substantially, the diffusion of a metal and/or of oxygen through it. Such layers are frequently implemented for electronic components. Non-limiting examples of barrier layers are layers used in transistor gates, for example to separate a layer of polysilicon from a conductive layer (for MOS or CMOS transistors for example), layers of material used as electrodes in capacitors (for example MIM (Metal-Insulator-Metal) capacitors or capacitors which are part of DRAM (Dynamic Random Access Memory)).

There is a desire to obtain low resistivities, particularly for applications such as electrodes.

Barrier layers currently in widespread use are, for example, composed of titanium nitride TiN. TiN barrier layers have, for example, a resistivity on the order of 500 $\mu\Omega\cdot$cm when they are deposited with an organometallic precursor. In general, the thickness of such a layer is on the order of several hundred Angstroms (Å). These are used in particular as a layer for preventing the diffusion of copper from a copper layer. They can generally be replaced by layers of TaN on Ta, depending on the type of integrated circuit.

It is advantageous if the TiN layers are used as electrodes in MIM capacitors.

It is known to deposit the TiN layers by various technologies where the decomposition of a precursor enables a deposition on a surface, particularly the technologies of physical vapor deposition (PVD), chemical vapor deposition (CVD), atomic layer deposition (ALD), or plasma-enhanced atomic layer deposition (PEALD). Examples of frequently used precursors include $TiCl_4$ or TDMAT (tetrakis(dimethylamido) titanium).

In general, the TiN compound deposited is substantially stoichiometric (50% Ti-50% N, expressed in atomic %).

Although widely used, this solution has certain disadvantages.

In fact, a TiN diffusion barrier may have defects. For example, when TiN is layered on an oxide layer or a copper layer, significant diffusion of oxygen or copper respectively through the TiN layer can occur. One explanation is that such undesirable diffusion can be attributed to the structure of the deposited TiN, which is in the form of columns.

BRIEF SUMMARY

Electronic components are provided which comprise a barrier layer with a resistivity close to, or even less than, that obtained with CVD or ALD TiN, and able to form a diffusion barrier which is an improvement over that obtained with TiN.

Thus, one embodiment provides an electronic component comprising a layered stack having a barrier layer of TiCN.

Another embodiment provides a process for depositing a TiCN barrier layer comprising: decomposing a titanium precursor chosen from the group consisting of tetrakis(dimethylamido)titanium and tetrakis(diethylamido)titanium on a substrate; and contacting the substrate with plasma by plasma-enhanced atomic layer deposition (PEALD) wherein the plasma comprises a hydrogen-rich gas having at most 5 atomic % nitrogen and at least 95 atomic % hydrogen.

BRIEF DESCRIPTION OF THE SEVERAL VIEWS OF THE DRAWINGS

For a better understanding of the present invention, some preferred embodiments thereof are now described, purely by way of non-limiting example, with reference to the attached drawings, in which.

DETAILED DESCRIPTION

One embodiment provides an electronic component comprising a barrier layer of TiCN. A layer is obtained of a material with no affinity for oxygen and that has a resistivity on the same order of magnitude as that of TiN, or even lower, and can advantageously reach values that are less than or equal to 200 $\mu\Omega\cdot$cm at a thickness of 200 Å.

In one embodiment, the TiCN barrier layer is more than 90% crystallized, or completely crystallized. Layers of CVD or ALD TiN are generally only partially crystallized, but with layers of ALD TiCN, highly crystallized or almost completely crystallized layers can be obtained (exceeding 95%, or exceeding a level of 98% crystals by volume in the layer material).

In one embodiment, the TiCN layer contains at most 0.5 atomic % oxygen, or at most 0.1 atomic % oxygen, which is below the detection limit of XPS analyses. In fact, a decrease in the oxygen level is seen to improve the role of the deposited TiCN layer as an oxidation barrier.

In one embodiment, the TiCN of the layer is of the following composition, expressed in atomic percentages:

Ti: between 40% and 60%, preferably between 45% and 55%,

C: between 10% and 15%, preferably near 12%,

N: between 30% and 50%, preferably between 35% and 45%.

The level of impurities, meaning elements other than Ti, C, N, or O, is less than or equal to 1 atomic %, with all the impurities together preferably at a level of less than or equal to 0.1 atomic %, which is the detection limit of XPS analyses.

Such a TiCN barrier layer can be used in numerous electronic components.

The component can be an active component, particularly a transistor, for example a C-MOS transistor, where the transistor gate comprises a TiCN layer.

Figure 1:
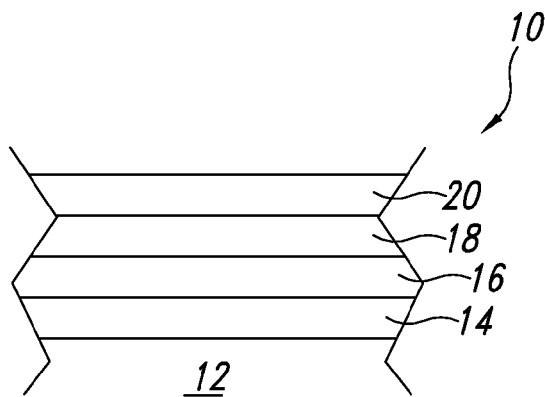
FIG. 1 shows a stack suitable as a transistor gate according to one embodiment.

FIG. 1 shows a stack 10 that can advantageously be layered on a substrate 12, comprising the following successive layers: dielectric layer 14, polysilicon layer 16, TiCN barrier layer 18, conductive layer 20, in order to form such a transistor gate.

The component can be a passive component, in particular a capacitor, for example a MIM (Metal-Insulator-Metal) capacitor, in particular a trench capacitor, or used in a DRAM memory where an electrode is of TiCN.

Figure 2:
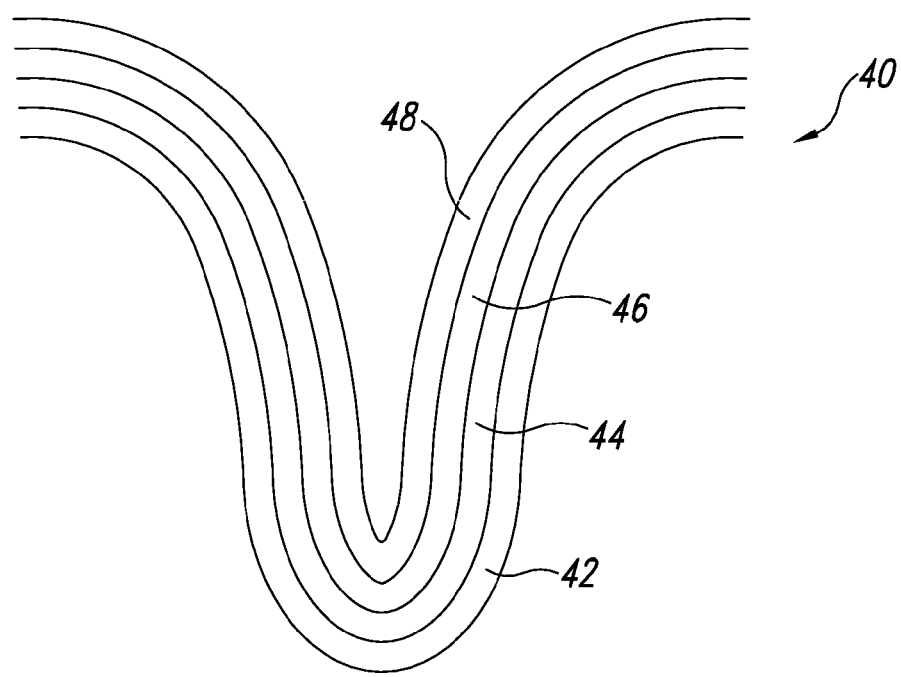
FIG. 2 shows a partial view of a trench capacitor according to one embodiment.

In general, MIM capacitors are implemented in the interconnections. In the case of a trench implementation, where the width of the trench is generally substantially less than its depth. FIG. 2 shows such a trench 40, in which a first layer of metal 42 is deposited, particularly of copper, then a barrier layer 44, which is a layer of TiCN as described herein, a dielectric layer 46, particularly of silicon oxide, metal oxide, or $Si_3N_4$, a TiCN barrier layer, and a copper layer 48. In this manner, a capacitor is formed where the TiCN acts as both an electrode and as a barrier layer preventing the diffusion of the copper to the dielectric layer, and the oxygen from an oxide to the copper.

In the case of a DRAM capacitor, successive layers can also be deposited in a trench. Such trenches are generally realized in the polysilicon substrate and can, for example, be a layering of TiCN, a dielectric, and TiCN.

A TiCN layer can also be used to encapsulate lines or vias in the interconnection zones.

A further embodiment provides a process of depositing a TiCN layer in order to obtain an electronic component where a titanium precursor is selected from among tetrakis(dimethylamido)titanium (TDMAT) and/or tetrakis(diethylamido)titanium (TDEAT) and is decomposed on a substrate by plasma-assisted atomic layer deposition (PEALD), where the plasma is obtained with a hydrogen-rich gas which can contain nitrogen with at most 5 atomic % nitrogen and at least 95 atomic % hydrogen. The plasma can additionally contain helium and/or argon as well.

Atomic Layer Deposition, or ALD, was developed to provide layers of high quality when the chemical compound of the layer includes atoms of a metal and atoms of an element bound to the metal atoms. In one variant of such a process, called Plasma-Enhanced Atomic Layer Deposition or PEALD, plasma is additionally used to activate the formation of the chemical compound, by combining, on the substrate surface, atoms of the binding element with those of the metal. A process of this type comprises the following steps, which are alternately repeated:

Step 1. Bring a gas containing first molecules of a metal precursor into contact with the substrate, with these precursor molecules able to bind by a chemical reaction to the substrate surface when the temperature of this substrate is within the range of chemisorption of the precursor, and Step 2. Form plasma in contact with the substrate, by simultaneously introducing into the plasma second molecules containing atoms of the binding element.

In such a process, layers of atoms of the metal and layers of atoms of the binding element are formed in alternation, by chemical reaction with an exposed material on the substrate surface. For the first deposited atomic layer, this chemical reaction occurs with the material which initially constitutes the substrate, and for the subsequent atomic layers, the reaction takes place with the last atomic layer just deposited.

In each step 1 of the process, the energy necessary to form a layer of the metal atoms is supplied as thermal energy, when the temperature of the substrate is within the range of chemisorption of the precursor. In other words, in each step 1, the temperature of the substrate is within a range that achieves a chemical equilibrium between the initial state of the metal atoms in the precursor molecules and the final state of these atoms when the precursor molecules have reacted at the substrate surface. When the substrate temperature is less than the lower limit of this range, then the deposition rate becomes too slow, and the resulting film is not sufficiently uniform. When the substrate temperature is higher than the upper limit of this range, then the organometallic precursor decomposes because of the heat, which modifies the physical properties of the film and creates contamination.

In each step 2 of the process, the energy necessary to form a layer of atoms of the binding element is supplied by the plasma. In particular, the energy supplied by the plasma to each molecule containing an atom of the binding element is greater than the activation energy of this molecule's reaction with an atom of the metal already bound to the substrate surface.

Such a plasma-enhanced atomic layer deposition process is adapted to form layers having very good conformity and in particular having a thickness on the order of a few nanometers.

The choice of the plasma gas n allows obtaining a TiCN layer on the surface of the substrate, from a TDMAT or TDEAT precursor.

The use of TDMAT and/or TDEAT is advantageous because it avoids using chlorine in the deposition and allows deposition conditions at moderate substrate temperatures, thus avoiding the creation of undesirable defects: corrosion, degradation of the general performance of the integrated circuit, etc.

The concentration of carbon in the obtained layer can vary as a function of the plasma components, particularly by adjusting the nitrogen content.

In one embodiment, the nitrogen content in the hydrogen-rich gas is at most 1 atomic %, or is even substantially zero.

In one embodiment, the temperature of the substrate at which the PEALD deposition occurs is less than 200° C., and in particular on the order of 150° C.

In an embodiment, a substrate (wafer) is brought to 1500 in an enclosure. A supply of TDMAT is connected to this enclosure while maintaining a vacuum. A valve is used to introduce the TDMAT into the enclosure or to cut off the flow. The TDMAT is brought to a pressure of about 20 Torr. After opening the valve, a jet of TDMAT is introduced into the enclosure for a period of 200 ms. The valve is then closed and the system is left to purge for 1500 ms at constant pressure. The pressure of the enclosure is maintained at constant pressure by adding hydrogen-rich gas and the plasma is activated during this period. This cycle is repeated until a layer of the desired thickness is obtained.

In this method, the enclosure is not completely purged between two cycles.

Under these conditions of implementing the process, TiCN layers were obtained, which have noteworthy properties.

The composition of the material in an example of an obtained layer is as follows:

Ti: 52 atomic %
N: 36 atomic %
C: 12 atomic %
O <0.1 atomic %

These levels were determined by XPS analysis of the atomic composition profile.

The obtained layer is substantially completely crystallized in an orthorhombic phase and x-ray diffraction peaks were identified at the orientations <111> and <200>. The resistivity of the layer was measured and a value of 190 $\mu\Omega\cdot$cm was obtained at 200 Å.

The composition of the layer is substantially constant for the entire thickness of said layer.

The invention is not limited to the elements described and is to be interpreted in a non-limiting manner, encompassing any equivalent embodiment.

The various embodiments described above can be combined to provide further embodiments. All of the U.S. patents, U.S. patent application publications, U.S. patent applications, foreign patents, foreign patent applications and nonpatent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic component comprising a layered stack having a barrier layer of TiCN, wherein the TiCN comprises, in atomic percentages:
   between about 40% and about 60% of titanium,
   between about 10% and about 15% of carbon, and
   between about 30% and about 50% of nitrogen, and wherein the TiCN of the barrier layer is more than 90% crystallized.

2. The electronic component according to claim 1, wherein the TiCN of the barrier layer is completely crystallized.

3. The electronic component according to claim 1, wherein the TiCN contains at most 0.5 atomic % oxygen.

4. The electronic component according to claim 3, wherein the TiCN contains at most 0.1 atomic % oxygen.

5. The electronic component according to claim 1, wherein the TiCN comprises, in atomic percentages: between about 45% and about 55% titanium; about 12% carbon, and between about 35% and 45% nitrogen.

6. The electronic component according to claim 1, where the electronic component is a transistor.

7. The electronic component according to claim 6, wherein the transistor is a CMOS transistor.

8. The electronic component according to claim 1, where the electronic component is a capacitor.

9. The electronic component according to claim 8, wherein the capacitor is a Metal-Insulator-Metal capacitor or a trench capacitor.

10. The electronic component according to claim 1, wherein the TiCN of the barrier layer is about 200 Å thick and has a resistivity of about 200 $\mu\Omega\cdot$cm.

11. An electronic component comprising a TiCN layer formed by:
    decomposing a titanium precursor chosen from the group consisting of tetrakis(dimethylamido)titanium and tetrakis(diethylamido)titanium on a substrate; and
    contacting the substrate with plasma of a hydrogen-rich gas having at most 5 atomic % nitrogen and at least 95 atomic % hydrogen, wherein the TiCN comprises between about 10% and about 15% of carbon.

12. The electronic component of claim 11 wherein the TiCN layer comprises, in atomic percentages:
    Ti: between about 40% and about 60%; and
    N: between about 30% and about 50%.

13. The electronic component according to claim 12, wherein the TiCN barrier layer comprises, in atomic percentages: between about 45% and about 55% titanium; about 12% carbon, and between about 35% and 45% nitrogen.

14. The electronic component according to claim 11, wherein the TiCN barrier layer is about 200 Å thick and has a resistivity of about 200 $\mu\Omega\cdot$cm.

15. A transistor comprising:
    a transistor gate including
        a conductive layer; and
        a TiCN barrier layer, wherein the TiCN is more than 90% crystallized, wherein the TiCN comprises, in atomic percentages: between about 40% and about 60% of titanium, between about 10% and about 15% of carbon, and between about 30% and about 50% of nitrogen, and wherein the TiCN contains at most 0.5 atomic % oxygen.

16. The transistor according to claim 15, wherein the TiCN is completely crystallized.

17. The transistor according to claim 15, wherein the TiCN barrier layer comprises, in atomic percentages: between about 45% and about 55% titanium; about 12% carbon, and between about 35% and 45% nitrogen.

* * * * *